(12) United States Patent
De Haas et al.

(10) Patent No.: US 10,020,841 B2
(45) Date of Patent: Jul. 10, 2018

(54) FEEDFORWARD RINGING SUPPRESSION CIRCUIT

(71) Applicant: NXP B.V., Eindhoven (NL)

(72) Inventors: Clemens De Haas, Ewijk (NL); Matthias Muth, Stelle (DE); Hartmut Habben, Hamburg (DE); Anthony Adamson, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/412,556

(22) Filed: Jan. 23, 2017

(65) Prior Publication Data

US 2017/0257140 A1    Sep. 7, 2017

(30) Foreign Application Priority Data

Mar. 3, 2016 (EP) ..................................... 16158523

(51) Int. Cl.
| | | |
|---|---|---|
| *H04L 12/40* | (2006.01) | |
| *H04B 3/20* | (2006.01) | |
| *H03K 5/1534* | (2006.01) | |
| *H04L 25/02* | (2006.01) | |
| *H04L 25/03* | (2006.01) | |

(52) U.S. Cl.
CPC ............. *H04B 3/20* (2013.01); *H03K 5/1534* (2013.01); *H04L 12/40013* (2013.01); *H04L 12/40032* (2013.01); *H04L 25/0278* (2013.01); *H04L 25/03834* (2013.01); *H04L 2012/40215* (2013.01); *H04L 2012/40273* (2013.01)

(58) Field of Classification Search
CPC ...... H04B 3/20; H04B 3/2642; H03K 5/1534; H04L 12/40; H04L 12/40006; H04L 12/40013; H04L 12/40019; H04L 12/40026; H04L 12/40032; H04L 12/40039; H04L 12/40045; H04L 12/40078; H04L 2012/40215; H04L 2012/4026; H04L 2012/40267; H04L 2012/40273

See application file for complete search history.

(56) References Cited

U.S. PATENT DOCUMENTS

| | | | |
|---|---|---|---|
| 8,593,202 B2 | 11/2013 | Mori et al. | |
| 9,461,694 B2 * | 10/2016 | Kim | ..................... H04B 1/40 |
| 2010/0097095 A1 | 4/2010 | Kao | |

(Continued)

FOREIGN PATENT DOCUMENTS

| | | |
|---|---|---|
| JP | H07273624 A | 10/1995 |
| JP | 5498527 B2 | 5/2014 |
| JP | 5543402 B2 | 7/2014 |

OTHER PUBLICATIONS

CAN in Automation (CiA) e. V., "CAN FD Node and System Design; Part 4: Ringing Suppression," Version: 0.0.0.4, Nov. 9, 2015, 9 pages.

(Continued)

*Primary Examiner* — Siu Lee

(57) ABSTRACT

A circuit is provided for ringing suppression. The circuit comprises a termination resistor coupled to a bus via a switch; and a control circuit. The control circuit comprises an input coupled to a data input pin of a bus transceiver and an output coupled to control the termination resistor. The circuit is configured to selectively couple the resistor to the bus in response to a transition on the input bit stream.

18 Claims, 5 Drawing Sheets

(56) References Cited

U.S. PATENT DOCUMENTS

2010/0124298 A1    5/2010  Jang
2012/0293230 A1*  11/2012  Mori ................... H04L 25/026
                                                        327/313
2014/0156893 A1    6/2014  Monroe et al.
2016/0036604 A1*   2/2016  Mori .................. H04L 25/0292
                                                        375/296

OTHER PUBLICATIONS

Islinger et al., "Ringing Suppression in CAN FD Networks," CAN newsletter, Jan. 2016, 6 pages.
Horii et al., "Ringing Suppression Technology to Achieve Higher Data Rates Using CAN FD," 15th international CAN Conference in Vienna, Oct. 27, 2015, 21 pages.
European Search Report dated Sep. 5, 2016 for corresponding EP Application No. 16158523.7, 8 pages.

* cited by examiner

FEEDFORWARD RINGING SUPPRESSION CIRCUIT

FIELD

The present application relates to bus operation and in particular to a ringing suppression circuit

BACKGROUND

A Controller Area Network (CAN) bus is a multi-master serial bus that connects one or more nodes in a network. The CAN bus is typically used in automotive and industrial automation applications, however may be applied to other applications. Use of the CAN bus is governed by various ISO standards, for example ISO11898-1 for the CAN protocol, ISO 11898-2 for high speed CAN Physical Layer and ISO 11898-3 for low speed or fault tolerant CAN Physical Layer.

Current CAN buses may able to support varying data rates, for example 1 Mb/s to 10 Mb/s. However the support of such data rates is dependent on the network being correctly terminated. In current networks, this termination may comprise, for example a 120 Ω termination resistance at the end nodes of the network and intermediate nodes being connected to the bus via stubs of a sufficiently short length. The termination is there to prevent reflections on the bus that may distort or compromise the integrity of the signaling on the bus.

The topology of the CAN bus network may comprise multiple nodes located at varying distances to the terminating resistances at the end nodes. The nodes furthest from the terminating resistors may cause reflection when one of the nodes transmit which may cause ringing on the bus. This may reduce the maximum data rate at which the bus may operate correctly.

Traditionally other factors, such as the length of the bus cable, limited the data rate to a speed below the speed at which ringing would become an issue. However advancement in the CAN bus protocol, for example CAN bus flexible data rate (CAN FD), have increased the possible data rate to a point at which ringing becomes influential.

It thus becomes of interest to address the termination resistance and/or the presence of ringing or reflections on the bus.

U.S. Pat. No. 8,593,202 provides a method of suppressing ringing by monitoring the signals on the CAN bus itself. When a state change on the bus is detected, a switch is closed for a fixed period of time to provide a lowering of impedance on the bus.

SUMMARY

According to a first aspect, there is provided a circuit comprising: a termination resistor coupled to a bus via a switch; and a control circuit comprising an input coupled to a data input pin of a bus transceiver and an output coupled to control the termination resistor; wherein the circuit is configured to selectively couple the resistor to the bus in response to a transition on the input bit stream.

The control circuit may comprise: an edge detector configured to detect a transition on the data input pin. The input may be a detection input of the edge detector. The control circuit may further comprise: a switch controller configured to close the switch in response to the edge detector detecting a first transition. The switch controller may be further configured to open the switch in response to the edge detector detecting a second transition. The first transition may be a dominant to recessive transition and the second transition may be a recessive to dominant transition.

The switch controller may be configured to close the switch for a set period of time. The set period of time may be shorter than a bit time of the input bit stream in a data phase of operation of the bus. The set period of time may be between great than 40% and less than 100% percent of the bit time of the bus during a data phase of operation. The switch controller may be further configured to open the switch after the set period of time. The termination resistor and the switch may be coupled in series between a first and second wire of the bus.

The data input pin may be coupled between a bus controller and bus transceiver and the control circuit is configured to detect a transition in a data bit stream provided from the bus controller to the bus transceiver. The edge detector may be configured to detect a dominant to recessive transition on the input bit stream. A dominant to recessive transition on the input bit stream may correspond to a falling edge on the input bit stream. The circuit may be a ringing suppression circuit.

According to a second aspect, there is provided a bus transceiver comprising: a data input pin configured to receive an input bit stream; a first output configured to output a bus signal; and the circuit according to the first aspect. The bus transceiver may be configured to convert the input bit stream to form the bus signal. The bus transceiver may be a controller area network (CAN) bus transceiver.

According to a third aspect, there is provided a system comprising: a plurality of nodes coupled to communicate via a controller area network (CAN) bus, wherein each node comprises a bus transceiver of the second aspect.

FIGURES

Embodiments will be described, by way of example only, with reference to the drawings, in which.

It will be appreciated that for features that span more than one drawing like reference numerals indicate the like feature.

DETAILED DESCRIPTION

Figure 1:
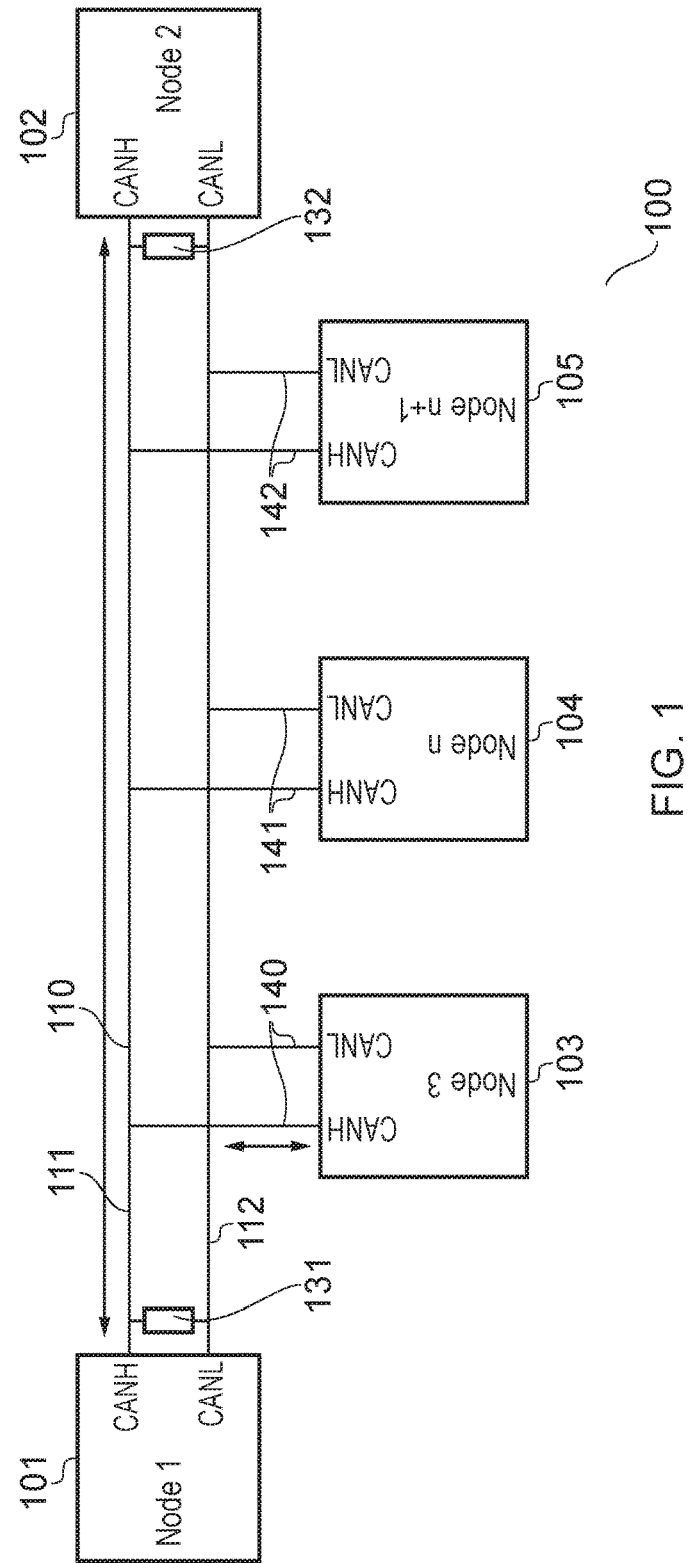
FIG. 1 is a schematic diagram showing an example of a CAN bus network with multiple nodes.

FIG. 1 shows an example of a network 100 comprising a plurality of nodes coupled together via a CAN bus.

The network 100 comprises a first node 101, a second node 102, a third node 103, an $n^{th}$ node 104 and an $(n+1)^{th}$ node 105. The nodes 101 to 105 are coupled together for communication by a CAN bus 110. The CAN bus 110 is a two wire bus comprising a CANH wire 111 and a CANL wire 112. In this case, the wires 111 and 112 form a twisted pair having a nominal line impedance. Each of the nodes 101 to 105 is coupled to the CANH 111 and CANL 112 wires.

In this example the nominal line impedance is 120 Ω, which is typical of some automotive applications of the CAN bus. It will however be appreciated that embodiments are applicable to other line impedances. It will also be appreciated that the exact impedance of the line may be affect by physical factors such as the cable and/or isolation material. While line impedance is assumed to be 120Ω, the actual line impedance may vary around this value and can be considered to be approximately 120Ω. Similarly, the termination resistors may vary as to their exact value due to real-world implementation.

The first node 101 is a first end node of the bus 110 and has a termination resistance 131 of 120Ω. It will be appreciated that 120Ω is in accordance with this example of cable impedance. The second node 102 is a second end node and has a termination resistance 132 of 120Ω. The third, $n^{th}$ and $(n+1)^{th}$ nodes are intermediate nodes and are coupled to the CAN bus 110 via stubs 140, 141 and 142. Such intermediate nodes may be unterminated or optionally applied with a high ohmic termination in the kilo-Ohms range in some systems. In some examples, high ohmic termination may provide limited ringing suppression at these quasi open ends of the cable, but the effectiveness is very limited due to the deviation from the nominal cable impedance.

Each of the nodes may be coupled to further circuity, such as sensors or microcontrollers, that may be configured to communicate with one or more of the other nodes using the CAN bus 110.

Figure 2:
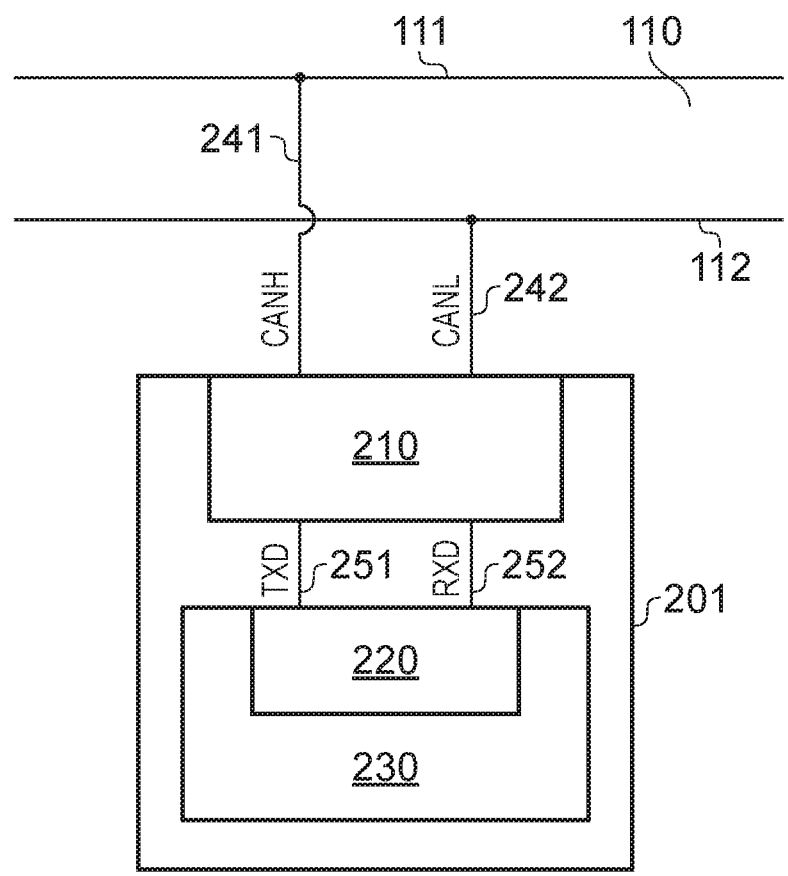
FIG. 2 is a schematic diagram of a node according to an example.

FIG. 2 shows an example of a node 201, for example one of the nodes 101 to 105 in more detail.

Node 201 is coupled to the CAN bus 110 with a stub 241 coupled to the CANH wire 111 and a stub 242 coupled to the CANL wire 112. The stubs 241, 242 are coupled to a CAN bus transceiver 210 of the node 201. It will be appreciated, that in the case where stubs are not needed, for example for an end node, the CAN bus transceiver will be coupled directed to the wires 111 and 112.

The CAN bus transceiver 210 is coupled to a CAN controller 220 via a transmit data connection (TXD) 251 and a receive data connection (RXD) 252.

The CAN controller 220 may form part of a microcontroller 230 of the node 201.

The microcontroller 230 may determine messages that are to be transmitted on the bus and provide these to the CAN controller 220. The microprocessor may receive messages from the bus from the CAN controller 220 and interpret them. The microcontroller 230 may be further connected to other entities, such as sensors or actuators and provide an interface between them and the bus.

The CAN controller 220 may receive bits from the bus (via the bus transceiver 210) and reconstruct the bits into a message to be interpreted by the microcontroller. The CAN controller may receive a message from the microcontroller 230 and provide it as serial bits to the bus via the CAN transceiver 210.

The CAN transceiver 210 which may convert the digital data bits on the TXD pin 251 from the CAN controller 220 into analogue bus signals. The CAN transceiver 210 may further convert the analogue bus signals into digital bits to be provided via the RXD pin 252 to the CAN controller 220.

The implementation of the network 100 may be governed by certain parameters in order to reduce ringing and protect the integrity of the signalled data at higher data rates. For example, the CAN bus 110 may have a maximum length at which maximum data rates may be achieved. In another example, the stubs 140, 141 and 142 connecting the intermediate nodes 101 to 105 to the CAN bus 110 may be kept as short as possible to reduce reflections. In one case, the maximum length of the CAN bus may be restricted to 40 m and the stubs to less than 0.3 m, however it will be appreciated that this is by way of example.

Despite this requirement, the length of the bus and the stubs may be subject to other factors. For example, in an automotive application for example, the implementation of the CAN bus network may be governed by the shape and size of a vehicle and position of the nodes. It may not always be possible to have stubs that are as short as desired. Furthermore, even in the case of the stubs being as short as is practical, ringing may still occur at higher data rates.

The ringing in the unterminated stub lines may corrupt the communication on the bus. This becomes more of a problem with new protocols, for example CAN FD, where the data rate is higher. One way to address ringing is to redesign network topology in order to improve termination however this is time consuming and costly.

Embodiment of the present application provide a method of supressing ringing that may be implemented on existing network topologies. Furthermore embodiments may take into account the speed at which this suppression is implemented and mitigate the potential of glitches occurring in ringing suppression circuits.

Figure 3:
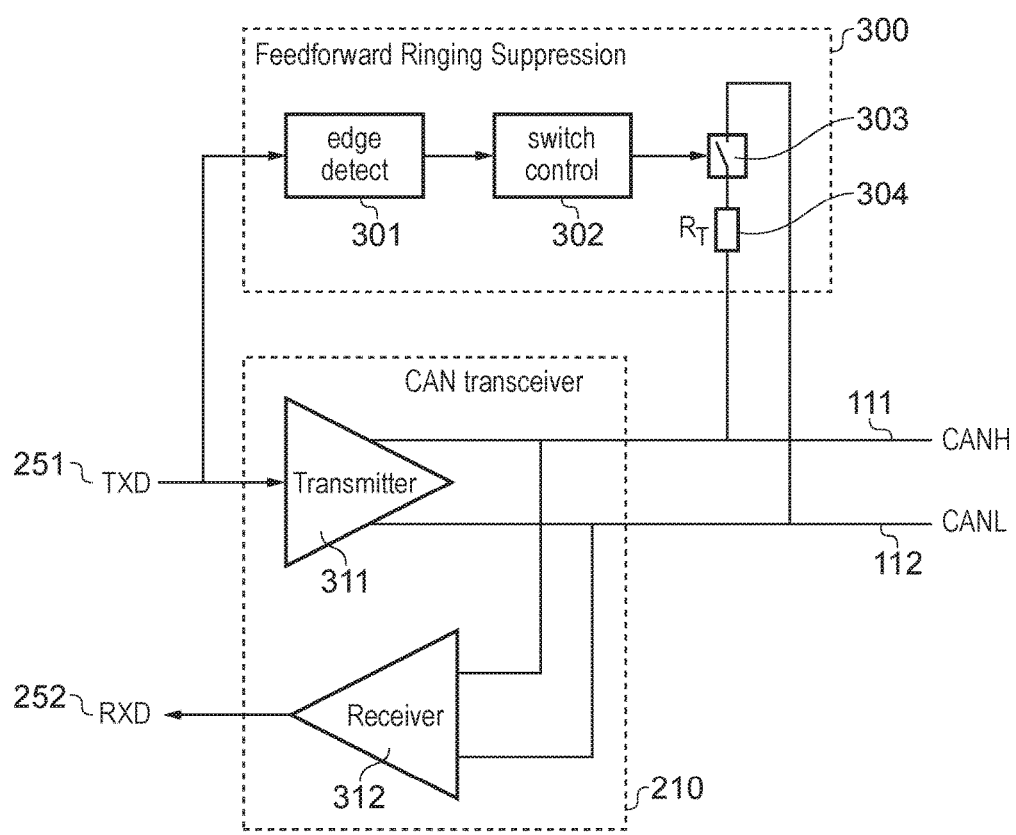
FIG. 3 is a schematic diagram showing a bus transceiver and circuit in accordance with an embodiment.

FIG. 3 shows a ringing suppression circuit 300 according to an embodiment. The circuit of FIG. 3 may be implemented as part of a CAN transceiver and a CAN transceiver 210 has been shown in the figure.

The CAN transceiver 210 of FIG. 3 is coupled to a transmit data input pin (TXD) 251 and a received data output pin (RXD) 252. It will be appreciated that in some example the TXD 251 and RXD 252 may be connections to a CAN controller, for example CAN controller 220. The TXD 251 may be connected to receive data to be transmitted on the bus and the RXD 252 may be connected to provide data that was received on the bus.

The CAN transceiver 210 is further coupled to a first CANH wire 111 of the CAN bus 110 and a second CANL wire 112 of the CAN bus 110. The CAN transceiver 210 may comprise a transmit amplifier 311, with an input coupled to the TXD 251 and a differential output coupled to the CANH 111 and CANL 112. The CAN transceiver 210 further comprises a receive comparator 312 with an output coupled to the RXD 252 and a differential input coupled to the CANH 111 and CANL 112.

FIG. 3 further shows a ringing suppression circuit 300 coupled to the TXD 251 and the CANH 111 and CANL 112. The circuit 300 comprises an edge detector 301, a switch controller 302, a switch 303 and a termination resistance ($R_T$) 304. An input to the edge detector 301 is coupled to the TXD 252 and an output of the edge detector 301 is coupled to an input of the switch control 302. An output of the switch control 302 is coupled a control input of the switch 303. The switch 303 is configured to couple a termination resistance 304 between the CANH 111 and CANL 112 when the switch is closed. In this example a first terminal of the switch 303 is coupled to the CANL 112 and a second terminal of the switch 303 is coupled to a first terminal of $R_T$ 304. A second terminal of $R_T$ 304 is coupled to the CANH 111.

The circuit 300 is configured to detect an edge on the TXD 251 and close the switch 303 in response. The switch is closed for set period of time in order to lower the impedance of the CAN bus 110 for that set period with the aim of reducing any potential reflection at the unterminated node. The period of time for which the switch is closed may be related to the data rate or rate at which data is transmitted on the CAN bus at the time of the detected transition. The period of time for which the switch should be closed may vary with different data rates of the bus. In particular, the data rate may change with an operation mode of the bus. For example, during an arbitration mode, the data rate may be slower to allow arbitration. In this case, the period of time for which the switch is closed may differ from the period of time for which the switch is closed when the bus is operating at or near to its maximum data rate.

In operation, the edge detector 301 detects an edge on the TXD 251 and provides an indication of the detected edge to the switch control 302. The switch controller 302 may close the switch 303 in response to the indication. The switch controller 302 may close the switch 303 for a set period of time, after which it will open the switch 303. When the switch 303 is closed, $R_T$ 304 is connected between CANH 111 and CANL 112 as the output of the CAN transceiver. This may provide a period of time during which the impedance of the CAN bus is reduced.

It has been described that the circuit 300 closes the switch 303 in response to the detection of an edge. In some examples, this edge is a transition from dominant to recessive state being asserted by a node 201. A node 201 can be considered to be asserting a recessive state when it is not transmitting (or not trying to transmit). The node 201 may assert a dominant state when it starts transmitting. In other words, the node asserts a dominant state when it has control over the state of the CAN bus 110.

When a node 201 is asserting a dominant state, the impedance on the CAN bus 110 is determined by the transmitter output stage which drives the CAN bus 110 low ohmic (~10Ω) to the 5V supply rail. The ringing in the network may be suppressed by the transmitter on recessive to dominant transitions.

At the transition from a dominant to recessive state, the impedance on the bus in the recessive state is determined by the termination resistors in the network. In the case where the termination resistors at the end nodes are about 120Ω, the termination resistors in parallel will provide an impedance of about 60Ω (for example ISO 11898-2 defines a target range between 45 and 70Ω).

In this case, the edge detector may be configured to detect an edge transistor from the dominant to recessive state and close the switch in response to this detection.

Figure 4:
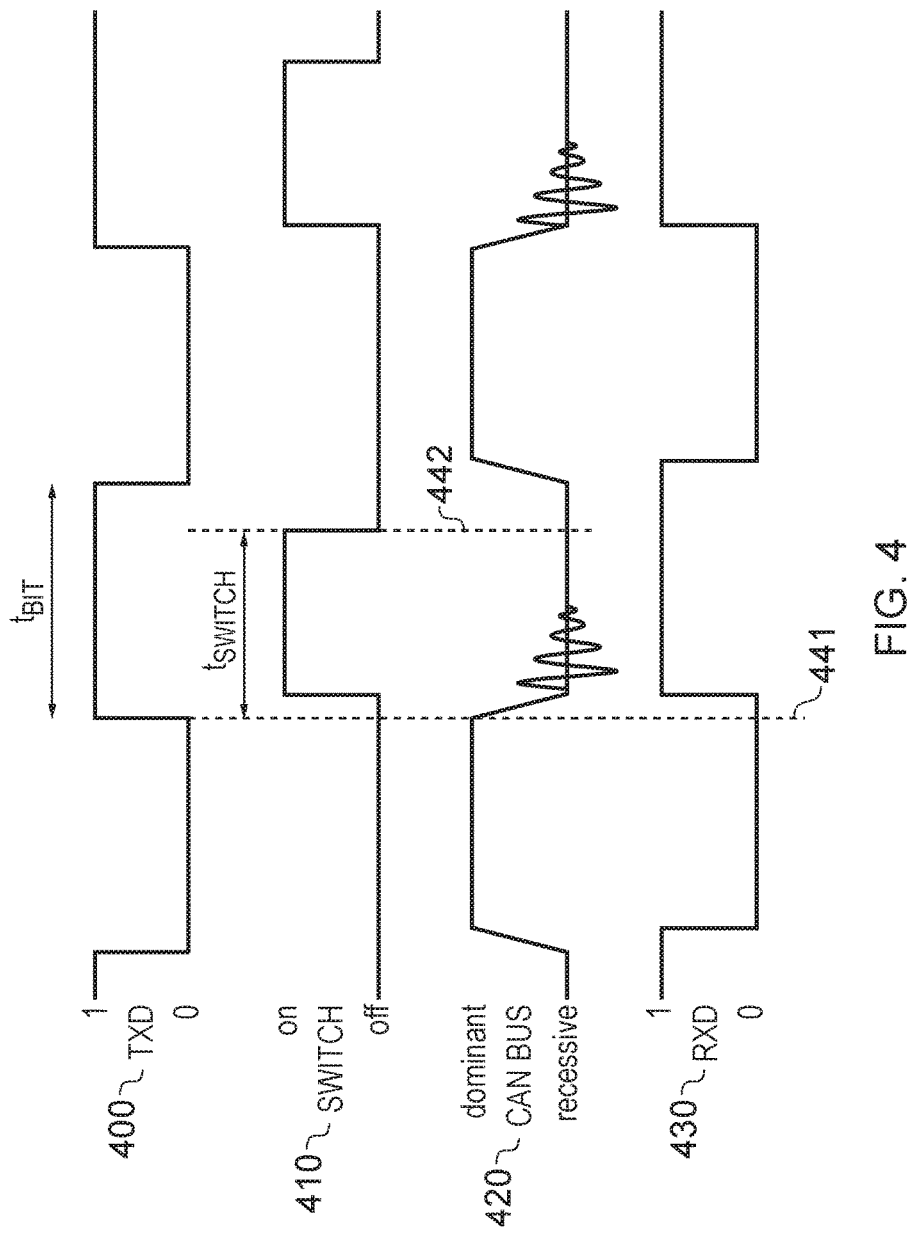
FIG. 4 is a signalling diagram showing an example operation of an embodiment.

FIG. 4 shows a signal diagram showing the operation of the circuit 300 when configured to detect a transition from a dominant to recessive state.

FIG. 4 shows a signal 400 of bits provided from the CAN controller to the CAN transceiver at connection TXD 251. In this example the time taken to transmit a bit $t_{BIT}$ is 500 ns, however it will be appreciated that this is an example only. It will be appreciated that the time taken to transmit a bit $t_{BIT}$ corresponds to the data rate of the CAN bus. In this case the data rate corresponds to a bit rate of $t_{BIT}$ of 500 ns, however the data rate can change with the operation of the CAN bus. It will be appreciated that when the data rate changes, for example due to a change in operation mode, the time period for which the switch is closed will change accordingly.

A switch control signal 410 is also shown, where the switch 303 is off or open when the signal is low and is on or closed when the signal is high. A signal 420 on the CAN bus is shown. When the CAN bus signal 420 is high, a dominant state is asserted and when the CAN bus signal 420 is low, a recessive state is asserted on the bus. A signal 430 shows the bits received on the bus by the CAN bus transceiver and provided to the CAN controller over connection RXD 252.

In operation, the CAN bus controller 220 provides a serial bit stream 400 to the CAN transceiver 210 for transmission on the bus. The edge detector 301 monitors edges on this bit stream. At time 441, the signal on TXD 400 transitions from low to high, which will cause a dominant to recessive transition on the CAN bus signal 420. It will be appreciated that the low to high transition of TXD 400 will not immediately cause a change on the CAN bus because there is a delay as the signal 400 is received by the CAN transceiver 210 and converted to a bus level for the CAN bus 210.

The edge detector 301 may indicate to the switch controller 302 that an edge has been detected and the control signal 410 from the switch controller 302 to the switch goes high. The switch controller 302 may be configured to keep the signal 410 high for a fixed period of time. In response to the control signal 410 from the switch controller 302, the switch 303 closes and connects the termination resistor $R_T$ 304 to the CAN bus 110. While the $R_T$ 304 is connected, ringing energy from the network may be suppressed.

After, the period of time, the switch controller signal 402 will go low again at 442 and the switch will open, disconnecting RT. In this example, the period of time for which the switch is closed ($t_{SWITCH}$) should be large enough to suppress the ringing and should be shorter than the bit time ($t_{BIT}$). It will be appreciated that the time values will be dependent on the data rate of the CAN bus. For example for communication at 2 Mbit/s, an example value of $t_{BIT}$ may be 500 ns and $t_{SWITCH}$ may be 400 ns with e.g. $R_T$=120 ohm. The timing parameter $t_{SWITCH}$ may be chosen for example to be a margin less than $t_{BIT}$, in this case the margin is 10% and the period for which the switch is closed is chosen as 400 ns. $R_T$ may for example be chosen to be the same as the characteristic impedance of the cable.

It will be appreciated that in the foregoing, actions have been associated with signals going high and low. It will be appreciated that the choice of high and low corresponds to dominant/recessive transitions and may differ for different bus systems. For example, in some cases a switch may be closed in response to the signal 410 going low inside of high if this corresponded to a dominant to recessive transition.

In the foregoing, the edge detector is described as detecting an edge on a signal from a CAN controller provided to a CAN transceiver. There may be implementations of a ringing suppression circuit provided on the CAN bus for detecting a transition of a CAN bus itself from dominant to recessive.

Detecting an edge on the TXD 251 provides an extra time for the reaction of the circuit 300. The edge on the TXD 251 is first processed by the CAN transceiver 210 before being output on the CAN bus 110. In embodiments of the present application, an edge may be detected before it is present on the CAN bus 110. If the edge were detected on the CAN bus, the timing constraints on the edge detector and switch would be far more severe.

If a transition were detected on the CAN bus itself, there may arise a situation where a disturbance on the CAN bus lines 111 and 112 may be interpreted as ringing and may unintentionally trigger the suppression circuit and with that unintentionally corrupt the CAN bus signal at any random time where such disturbance occurs.

In examples of the application, a ringing suppression circuit responds to a dominant to recessive transition on a transmit data input pin 251 to a CAN bus transceiver rather than a transition detected on the CAN bus itself. Each node of the system may have a ringing suppression circuit coupled to it. In this case, the ringing suppression circuits of each of the nodes may be reacting to different signals as opposed to a signal transition on the bus itself. In particular, this issue may arise in a scenario in which or more nodes (or bus transceivers) are active on the bus at the same time.

In a first case, two or more nodes (bus transceivers) may be active on the bus but be transmitting the same data. After the two or more nodes transmit a dominant to recessive transition, the ringing suppression circuitry of the two or more nodes will close their respective switches. In this case, the effect may be similar to if only one node was active.

In a second case, two or more nodes may be active on the bus but may transmit different data. In this scenario a first plurality of nodes transmit a bit corresponding to a recessive state and a second plurality of nodes transmit a bit corresponding to a dominant state. The ringing suppression circuits of the nodes transmitting a recessive bit will close their respective switches for a set period of time ($t_{SWITCH}$). Having these switches closed during this period ($t_{SWITCH}$) may lead to the voltage on the bus being undefined because the closing of the respective switches may lower the impedance of the bus to less than the minimum impedance (for example 50Ω).

The inventors of the application have investigated the scenarios in which two or more nodes (bus transmitters) may be active on the bus at the same time and in particular where two or more nodes are active at the same time while transmitting different things.

Figure 5:
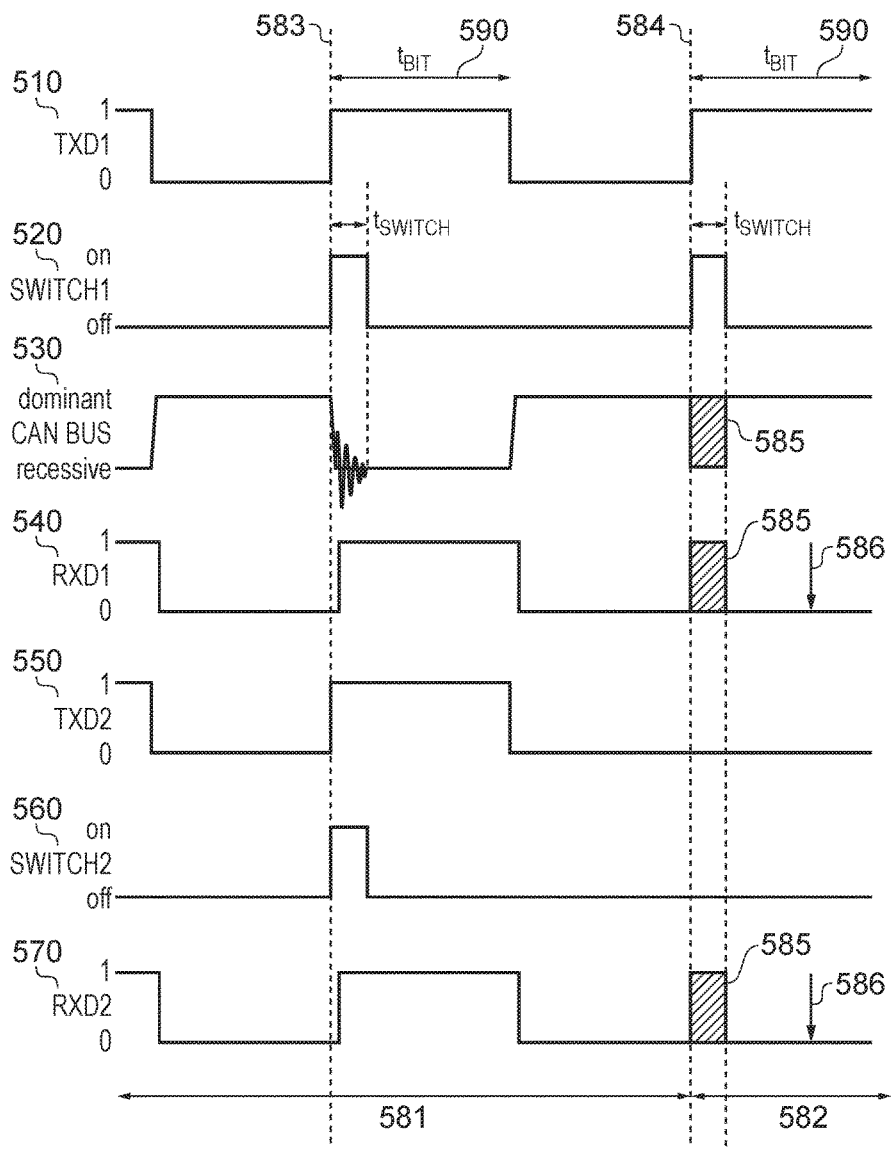
FIG. 5 is a signalling diagram showing a further example of operation of an embodiment.

In these three scenarios, the data rate on the bus corresponds to an arbitration speed of an arbitration phase which is slower than a data rate of a data phase of the bus. FIG. 5 shows an example of multiple bus transmitters being active on the bus according to one or more of these scenarios.

FIG. 5 is a signalling diagram showing the signalling of a first and second bus transceiver and associated ringing suppression circuitry. FIG. 5 shows a first scenario 581 where the first and second bus transceivers are both active and transmitting the same data. FIG. 5 also shows a second scenario 582 where the first and second transceivers are both active and transmitting different data.

For the first transceiver and associated ringing suppression circuitry, a transmit data pin signal (TXD1) 510 and receive data pin signal (RXD1) 540 is shown. It will be appreciated that these signals may be the signals present on the transmit data input pin 251 and the receive data output pin 252 of the first bus transceiver 210. A switch control signal (SWITCH1) 520 of the ringing suppression circuit 300 associated with the first bus transceiver 210 is also shown where a low value corresponds to the switch being off or open and a high value corresponds to the switch being closed or on.

For the second transceiver and associated ringing suppression circuitry, a transmit data pin signal (TXD2) 550 and receive data pin signal (RXD2) 570 is shown. It will be appreciated that these signals may be the signals present on the transmit data input pin 251 and the receive data output pin 252 of the second bus transceiver 210. A switch control signal (SWITCH2) 560 of the ringing suppression circuit 300 associated with the first bus transceiver 210 is also shown where a low value corresponds to the switch being off or open and a high value corresponds to the switch being closed or on.

A signal (CAN BUS) 530 is also shown. This signal is the signal on the CAN bus itself.

From FIG. 5, it can be seen that for a first period 581, TDX1 510 and TDX2 are transmitting the same data. In this case both the first and second bus transceivers are active and transmitting (or attempting to transmit) the same data on the bus. At time 583, the signal TXD1 510 at the first bus transceiver and the signal TXD2 550 at the second bus transceiver both transition from low to high providing a dominant to recessive edge. The respective bus transceivers convert TXD1 and TXD2 for output on the CAN bus. The ringing suppression circuit at the first bus transceiver detects the transition on TXD1 510 and the ringing suppression circuit at the second bus transceiver detects the transition on TXD2 550. In response to the detection of the edge, the respective switch control signals SWITCH1 520 and SWITCH2 560 of the first and second ringing suppression circuits therefore go high. The CAN bus 530 starts a transition from dominant to recessive at time 583.

It will be noted that the bit rate of the example of FIG. 5 is given as the arbitration bit rate. This is because the scenarios in which more than one bus transmitter is active at the same time occur all corresponds to the arbitration bit rate rather than the (faster) data bit rate. The inventors have identified three scenarios in which more than one bus transmitter may be active simultaneously.

There are three scenarios in the CAN/CANFD protocol in which two or more transmitters may be active on the CAN bus at the same time.
1) During an arbitration phase which may occur at the start of each CAN frame to determine the node which is allowed to transmit. In this example, the practical arbitration speed is 500 kbit/s, which gives rise to $t_{BIT}=2$ us
2) During an error frame. At any moment in time a node is allowed to interrupt the communication to signal an error has being detected. The interrupting node in this example will send six dominant bits at arbitration speed (for example, 500 kbit/s with $t_{BIT}=2$ us)
3) During acknowledge bit. All nodes except the sending node of a finished message may send a dominant ACK bit to the bus to signal the proper format of the sent CAN frame. This take place at arbitration speed (500 kbits/s with $t_{BIT}=2$ us).

In this example the arbitration bit rate is given as 500 kbit/s with the bit time $t_{BIT}=590$ being 2 us. This is by way of example only and the values of the arbitration rate may change. However, it will be appreciated that the arbitration bite rate is always slower than the data phase bit rate.

In this example, a switch 303 may be closed for a period of time. This period of time is defined in relation to a bit time $t_{BIT}$ of a data phase of the CAN bus. In this example, the $t_{BIT}$ of the data phase may be 500 ns (corresponding to a maximum data phase bit rate of 2 Mbits/s). The time for which the switch is closed is long enough affect the impedance and supress ringing but less than the bit time of the data phase. In one example, the set period for which the switch is closed may be 90% of the $t_{BIT}$. In this case 400 ns.

Referring back to FIG. 5, the switch control signals SWITCH1 520 and SWITCH2 560 close the respective switches for the set period. The set period is less than the $t_{BIT}$ of the data phase and so in the arbitration phase, the set period is a fraction of the $t_{BIT}$ of the arbitration phase. In a practical example the $t_{BIT}$ of the arbitration phase is 2 us and the $t_{BIT}$ of the data phase is 500 ns, therefore the switches are closed for less than a quarter of the arbitration phase $t_{BIT}$.

At time 583, the CAN bus may transition from a domination to recessive state. Even if the voltage on the bus became undefined due to the closing of multiple switches, the period for which the voltage is undefined is small compared to the arbitration phase $t_{BIT}$.

The time period 582 shows a case where the first and second bus transceivers are attempting to transmit different data to the CAN bus. At time 584, the first bus transceiver receives a low to high transition on its TXD pin (TXD1) 510 and the second bus transceiver receives a low on its TXD pin (TXD2) 550. In arbitration, the second bus transceiver gains control of the bus and the signal on TXD2 is converted to bus levels and output to the CAN bus 530.

The ringing suppression circuit of the first bus transceiver detects the transition on TXD1 510 provides a signal SWITCH1 to close its switch. Closing the switch in response to SWITCH1 couples the CAN bus to a termination resistor even though the edge TXD1 510 is not being output on the bus. This may lead to an undefined voltage 585 on the CAN bus 530 for the duration of the switch being closed.

The first and second bus transceivers detect the signals on the bus and provide them to their respective CAN controllers via receive output pin signals RXD1 540 and RXD2 570. RXD1 540 and RXD2 570 show the undefined voltage 585 being provided to the respective CAN controllers. The set period for which the switch is closed is small in comparison with the arbitration bit time and so the period for which the voltage is undefined is small in comparison with $t_{BIT}$. A CAN controller may sample an incoming RXD and this is typically not done at the very start of a bit, but rather between the middle and the end. The CAN controller sampling point of the signals RXD1 540 and RXD2 570 is shown at 586. In some examples the sample time may be at 50% to 80% of the bit time $t_{BIT}$. It can be seen that the signals RXD1 and RXD2 are sampled after any switch is reopened and the voltage on the bus is no longer undefined.

In the foregoing reference has been made to an arbitration phase and a data phase of the CAN bus. The access mechanism of the CAN bus is a bitwise arbitration, during this time the bit rate of the bus is reduced. The arbitration bit rate may also be used for example with an error detection. The data rate of the CAN bus is much faster than the arbitration bit rate. For example, while the arbitration bit rate may be in the vicinity of 500 bit/s, the data bit rate may be higher than 2 Mbit/s in some systems. It will be appreciated that the data and arbitration bit rates may differ in different implementations, however the arbitration bit rate is necessarily a fraction of the data bit rate.

In the foregoing, the set period of time for which a switch is closed is discussed. In some examples this set period may correspond to a margin less than the bit time $t_{BIT}$ of the data rate of the data phase. Examples have been given of the set period being approximately 90% of the bit time $t_{BIT}$ of the data phase however it will be appreciated that in some cases the set time may correspond to a time that is more than 40% and less than 100% of the bit time of the data phase. It will be appreciated that the bit time and data rate at which the CAN bus operates may change with the type of operation of the CAN bus. An example is given above in FIG. 5 where the CAN bus operates at an arbitration data rate. In an example where the set time period is set to be 90% of the bit time of a data phase, it will be appreciated that the set time period will be less than 25% of the bit time in the arbitration phase.

There may however arise a situation where the data rate of the CAN bus may increase so that the set time period is now more than 100% of the bit time. Alternatively, the set period may be so long that the switch remains closed even when a second transition occurs. For example, a device specified for a data phase data rate of 2 Mbit/s ($t_{BIT}$=500 ns) may have a set period for the switch of $t_{SWITCH}$=400 ns). If this device is used for faster data-rates where the $t_{BIT}$<400 ns, the switch may remain closed at the end of the bit time and be closed when a second transition occurs. This would result a short current between the switch and the transmitter.

In embodiments, the ringing suppression circuit may detect a first transition and close the switch in response thereto. In a further embodiment, the ringing suppression circuit may further detect a second or next transition after the first transition and open the switch in response thereto. In a specific example, the ringing suppression circuitry may detect a dominant to recessive transition on the TXD pin of the bus transceiver and close the switch in response thereto. The ringing suppression circuit may continue to monitor the TXD pin and detect a subsequent recessive to dominant transition on the pin. The ringing suppression circuit may open the switch in response to this detection.

In the foregoing, examples have been described with reference to a CAN bus. It will however be appreciated that embodiments may be applicable to other differential or two wire buses where ringing may be an issued. It will also be appreciated that while the foregoing has described a dominant to recessive transition on a TXD pin as a transition from high to low, this is a matter of design and it may be the inverse in some other systems. In one example, embodiments may operate in accordance with CAN FD with the bit time of the data phase corresponding to a bit time of a CAN FD frame.

The invention claimed is:

1. A circuit comprising:
   a termination resistor having a first terminal coupled to a first bus, and a second terminal coupled to a second bus via a switch;
   a control circuit comprising an input directly connected to a data input pin of a first bus transceiver and an output coupled to control the switch; and
   a switch controller configured to close the switch for a predetermine amount of time in response to the control circuit detecting a first transition;
   wherein the switch controller is configured to selectively couple the second terminal of the resistor to the second bus to couple the termination resistor as an output of the bus transceiver in response to the first transition on an input bit stream received at the data input pin, wherein a voltage level between the first bus and the second bus is undefined based on the switch being closed for the predetermined time while a second bus transceiver has gained control of the first bus and the second bus through arbitration.

2. The circuit of claim 1 wherein the control circuit comprises:
   an edge detector configured to detect a transition on the data input pin.

3. The circuit of claim 2 wherein the input is a detection input of the edge detector.

4. The circuit of claim 1 wherein the switch controller is further configured to open the switch in response to the edge detector detecting a second transition.

5. The circuit of claim 4 wherein the first transition is a dominant to recessive transition and the second transition is a recessive to dominant transition.

6. The circuit of claim 1 wherein the switch controller is configured to close the switch for a set period of time.

7. The circuit of claim 6 wherein the set period of time is shorter than a bit time of the input bit stream in a data phase of operation of the bus.

8. The circuit of claims 6, wherein the set period of time is more than 40% and less than 100% of the bit time of the bus during a data phase of operation.

9. The circuit of any of claim 6, wherein the switch controller is further configured to open the switch after the set period of time.

10. The circuit of claim 1 wherein the termination resistor and the switch are coupled in series between a first and second wire of the bus.

11. The circuit of claim 1 wherein the data input pin is coupled between a bus controller and bus transceiver and the control circuit is configured to detect a transition in a data bit stream provided from the bus controller to the bus transceiver.

12. A bus transceiver comprising:
a data input pin configured to receive a input bit stream;
a first output configured to output a bus signal; and
a circuit that includes
   a termination resistor having a first terminal coupled to a first bus, and a second terminal coupled to a second bus via a switch;
   a control circuit comprising an input directly connected to the data input pin of the bus transceiver and an output coupled to control the switch; wherein the circuit is configured to provide a signal; and
   a switch controller coupled to the output of the control circuit, the switch controller configured to close the switch for a predetermine amount of time in response to the control circuit detecting a first transition, when the switch is closed the second terminal of the termination resistor is coupled to the second bus to couple the termination resistor as an output of the bus transceiver in response to the first transition on the input bit stream received at the data input pin, wherein a voltage level between the first bus and the second bus is undefined based on the switch being closed for the predetermined time while a second bus transceiver has gained control of the first bus and the second bus through arbitration.

13. The bus transceiver of claim 12 wherein the bus transceiver is configured to convert the input bit stream to form the bus signal.

14. A system comprising:
a plurality of nodes coupled to communicate via a controller area network (CAN) bus,
   wherein each node comprises a bus transceiver that includes:
      a termination resistor having a first terminal coupled to a first bus, and a second terminal coupled to a second bus via a switch;
      a control circuit comprising an input directly connected to a data input pin of a bus transceiver and an output coupled to control the switch; and
      a switch controller coupled to the output of the control circuit the switch controller configured to close the switch for a predetermine amount of time in response to the control circuit detecting a first transition, when the switch is closed the second terminal of the termination resistor is coupled to the second bus to couple the termination resistor as an output of the bus transceiver in response to the first transition on an input bit stream received at the data input pin, wherein a voltage level between the first bus and the second bus is undefined based on the switch being closed for the predetermined time while a second bus transceiver has gained control of the first bus and the second bus through arbitration.

15. The system of claim 14 wherein the control circuit comprises:
an edge detector configured to detect a transition on the data input pin.

16. The system of claim 15 wherein the input is a detection input of the edge detector.

17. The system of claim 14 wherein the switch controller is further configured to open the switch in response to the edge detector detecting a second transition.

18. The system of claim 14 wherein the termination resistor and the switch are coupled in series between a first and second wire of the bus, and the data input pin is coupled between a bus controller and bus transceiver and the control circuit is configured to detect a transition in a data bit stream provided from the bus controller to the bus transceiver.

* * * * *